United States Patent [19]

Buzak

[11] Patent Number: 4,864,538
[45] Date of Patent: Sep. 5, 1989

[54] METHOD AND APPARATUS FOR ADDRESSING OPTICAL DATA STORAGE LOCATIONS

[75] Inventor: Thomas S. Buzak, Beaverton, Oreg.

[73] Assignee: Tektronix, Inc., Beaverton, Oreg.

[21] Appl. No.: 190,435

[22] Filed: May 5, 1988

[51] Int. Cl.$^4$ .............................. Q11C 11/42
[52] U.S. Cl. .................... 365/128; 365/112; 365/118; 340/799
[58] Field of Search ............ 365/106, 112, 118, 128; 340/777, 799

[56] References Cited

U.S. PATENT DOCUMENTS

| | | | |
|---|---|---|---|
| 3,688,281 | 8/1972 | Veith | 365/128 |
| 3,904,915 | 9/1975 | Hinson | 340/771 |
| 4,027,195 | 5/1977 | Shutch | 340/771 |
| 4,090,253 | 5/1978 | Salgo | 365/128 |
| 4,430,648 | 2/1984 | Tagashi et al. | 340/784 |

OTHER PUBLICATIONS

Farrayre et al., "Geometrical Resolution Improvement of Sodern Visualization System," *SID 85 Digest*, 266–269.

*Primary Examiner*—Terrell W. Fears
*Attorney, Agent, or Firm*—John D. Winkelman; Mark M. Meininger; Paul S. Angello

[57] ABSTRACT

An apparatus for and a method of addressing data storage locations (80) employs an electron beam (76) to address such storage locations and thereby store data in and read data out of them. The storage locations are defined by the overlapping areas of multiple column electrodes (62) extending in a common direction on a first substrate (82) and rows (120) addressed by an electron beam (76) and extending in a common direction on a second substrate (54). A layer of dielectric material (52) separates the first and the second substrates, which are positioned face-to-face and spaced-apart with the direction of the addressed rows transverse to that of the column electrodes. The column electrodes receive data drive signals. The addressing apparatus is configured so that for each storage location secondary electrons emitted by the electron beam striking the location function as an electrical switch that changes between a conducting state and a nonconducting state in response to the presence of the electron beam. The secondary electrons function to either store data in or read data out of the storage location. If the storage location includes a layer (52) of material having electro-optic properties and receives incident image-carrying light, the secondary electrons function to select and store image data across the layer and thereby provide a display system having gray scale luminance.

22 Claims, 5 Drawing Sheets

DIGITAL OR ANALOG DATA VOLTAGE → DIGITAL OR ANALOG LINE STORE (LINE MEMORY, CCD, OR SAMPLE & HOLD)

STROBE ---- 86 ---- 86 ---- 86

CLOCK SIGNAL

88b

ANALOG DATA VOLTAGE → 128, 128, 128

88 — DATA DRIVER 86, 86, 86, 86, 86

62, 62, 62, 62, 62

40

9 LINES WITH 9 AMPLIFIERS

FIG. 8B

88 — DATA DRIVER 86, 86

62, 62, 62, 62, 62

40

9 LINES WITH 3 AMPLIFIERS

FIG. 9

METHOD AND APPARATUS FOR ADDRESSING OPTICAL DATA STORAGE LOCATIONS

TECHNICAL FIELD

The present invention relates to systems having multiple optical data storage locations and, in particular, to apparatus and methods in which multiple information-carrying surface electrodes and an electron beam cooperate to address an array of such storage locations.

BACKGROUND OF THE INVENTION

Systems employing optical data storage locations include, for example, video cameras and image displays. Such systems employ an addressing structure that provides data to or retrieves data from the storage locations. One system of this type is a general purpose flat panel display, whose storage or display locations store light pattern data. A flat panel display comprises multiple display locations distributed throughout the viewing area of a display surface.

One type of flat panel display system employs a matrix-type addressing structure that accomplishes direct multiplexing of multiple liquid crystal cells that are arranged in an array and function as the display locations. Each of the liquid crystal cells is positioned between a pair of electrical conductors that selectively apply select and deselect voltage signals across the liquid crystal cell to change its optical properties and thereby change the brightness of the image it develops. A display system of this type is characterized as "passive" because no "active" electronic device cooperates with the liquid crystal cell to modify its electro-optical properties. Such a display system suffers from the disadvantage of being capable of implementation in only a low resolution display application having a limited number of addressable lines (i.e., up to about 250) of video information or data for developing a display image. Such a display system may also suffer from the disadvantages of providing limited gray scale, relatively low image contrast, and a small range of viewing angles.

Another type of flat panel display system having a matrix-type addressing structure employs an array of electrically "active" elements that act as electronic switches at each of the display locations. Such a display system may employ, for example, thin film transistors (TFT) having nonlinear signal processing characteristics that cooperate with the liquid crystal material to provide a full gray scale capability. Such a display system is capable of providing high resolution displays, good image contrast, and relatively wide range of viewing angles. A display system of this type suffers, however, from the disadvantage of being very difficult to fabricate with high production yields because of the large number of electronic elements and data drivers required in such a system. For example, a 1,000 line full color display system of this type could require up to about 3 million electronic elements and about 4,000 data drivers.

Another type of prior art display system, which is not of the flat panel type, employs a solid crystal cell and an electron beam that cooperate to form a display location addressing system. Such a display system is described in Farrayre et al., "Geometrical Resolution Improvement of Sodern Visualization System," *SID 85 Digest*, 266-269. Pertinent portions of the Sodern display system are discussed below with reference to FIGS. 1 and 2.

Figure 1:
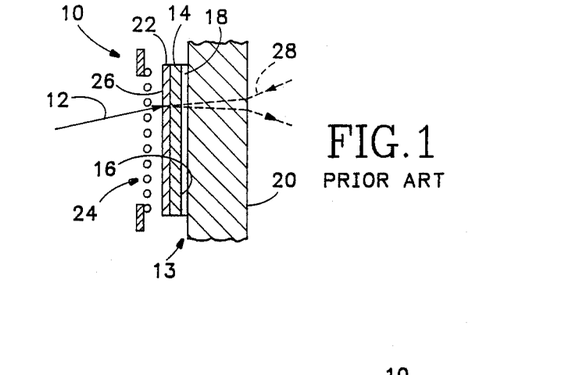
FIG. 1 is a cross sectional view of a prior art display system having an addressing apparatus that employs an electron beam.
Figure 2:
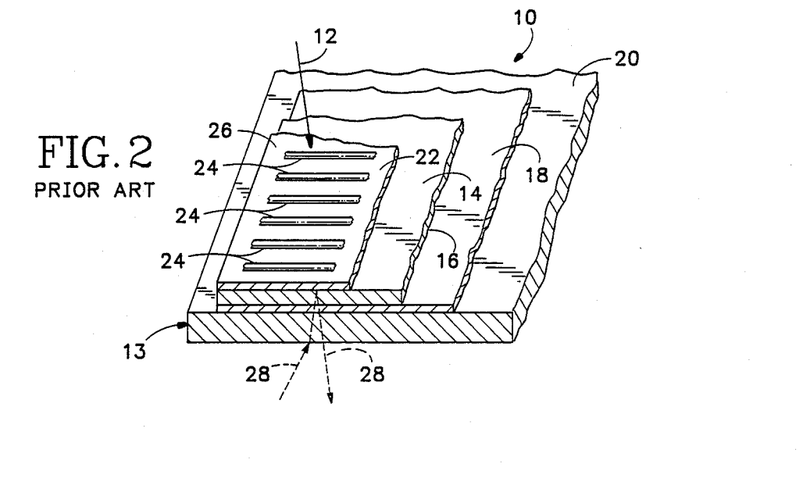
FIG. 2 is a fragmentary isometric view showing the layers of structural materials that form the display panel of the prior art display system of FIG. 1.

FIGS. 1 and 2 are respective cross sectional and fragmentary isometric views of a prior art display system 10 that employs an electron beam 12 of constant beam current to address particular locations on a liquid crystal display panel 13. Display panel 13 includes a solid crystal dielectric target 14 having a front surface 16 on which a single optically transparent electrode 18 is deposited. Dielectric target 14 is positioned face-to-face between an optically transparent substrate 20 and a dielectric optical mirror 22. A control grid 24 formed of closely spaced parallel wires and positioned proximally to a back surface 26 of dielectric mirror 22 receives video voltages to operate display system 10 in one of at least two possible modes.

In the preferred "potential stabilization" mode of operation, video voltages are applied between control grid 24 and single transparent electrode 18. Electron beam 12 strikes a location on dielectric mirror 22 and causes the emission therefrom of secondary electrons that function as a "local short circuit" between dielectric mirror 22 and control grid 24. The short circuit induces across dielectric target 14 a voltage that equals the video voltage applied between control grid 24 and transparent electrode 18 and thereby addresses at the location a pixel whose luminance corresponds to the video voltage.

Light rays 28 (one shown) propagate successively through first and second neutral density linear polarizers (not shown). The polarizers are positioned so that light rays 28 incident to display system 10 pass through the first polarizer, reflect off dielectric target 14, and then pass through the second polarizer. The video voltage induced across dielectric target 14 at the addressed pixel modulates the polarization of the light rays 28 that propagate through the pixel. The polarization modulation causes intensity modulation of light rays 28, which corresponds to video information.

Display system 10 cannot, however, be easily manufactured for at least three reasons. First, all video information is applied to display system 10 as video voltages between control grid 24 and the single transparent electrode 18, thereby requiring a data drive circuit having a very high signal bandwidth. Second, control grid 24 and transparent electrode 18 generate a substantial capacitance that can limit the bandwidth of such a data drive circuit. Third, writing video information on display system 10 by means of providing voltage differences between control grid 24 and transparent electrode 18 requires that control grid 24 be accurately positioned extremely close to dielectric target 14 to provide sufficiently accurate addressing sensitivities.

SUMMARY OF THE INVENTION

An object of the present invention is, therefore, to provide a system in which multiple information-carrying surface electrodes and an electron beam cooperate to form an addressing structure.

Another object of this invention is to provide such a system that is capable of operating with signals provided by relatively low bandwidth data drive circuitry.

A further object of this invention is to provide such a system that is comparatively simple to manufacture.

Still another object of this invention is to provide such a system that is capable of being implemented in a display apparatus to provide it with a wide range of viewing angles and high resolution, full gray scale, and good image contrast properties.

The present invention relates to an apparatus for and methods of addressing data storage locations. The invention is described herein only by way of example with reference to two embodiments relating to a high resolution display system and a memory device.

The first embodiment comprises an addressing structure implemented in a high resolution display system that can be used in either direct view or projection applications. The display system includes a display surface formed of an array of data storage or display locations distributed throughout the viewing area thereof. The display locations comprise an electro-optic material, such as a nematic liquid crystal, that is positioned between multiple optically transparent electrical conductors and a dielectric substrate that is addressed by an electron beam. The electro-optic material cooperates with the electrical conductors and the electron beam-addressed dielectric substrate to modulate externally generated light propagating through the display locations.

The second embodiment comprises an addressing structure implemented as part of a memory device into which and out of which analog information can be, respectively, electronically written or electronically read. The memory device includes an array of data storage or memory locations that comprise a dielectric material, such as glass, plastic, or photoconductor, that has multiple electrical conductors extending across a first major surface and is addressed on a second major surface by an electron beam. The electron beam and the multiple electrical conductors cooperate to provide a way of addressing a memory location to read out a signal previously developed across the memory location, irrespective of the manner in which it acquired the signal.

The storage locations are arranged in columns and rows for both embodiments. In the first embodiment, a row represents one line of video information or data; and in the second embodiment, a row represents a set of discrete quantities of analog information or data. (The information addressed in either embodiment is hereafter referred to as "data".) The multiple electrical conductors are arranged in columns and receive the data, and an electron beam of constant current is scanned across the dielectric substrate to address the columns in a raster scan fashion.

In particular, either the display panel of the first embodiment or the memory device of the second embodiment comprises first and second spaced-apart substrates positioned face-to-face to each other. Multiple nonoverlapping electrical conductors extending generally in a first direction along the inner surface of the first substrate form column electrodes for data drive signals applied to them. An electron beam is scanned in a second direction across a target surface positioned in opposition to the inner surface of the second substrate. The first and second directions preferably align with the vertical and horizontal directions, respectively.

An electron-transparent reference potential electrode is positioned over and in substantially parallel spaced-apart relation to the target surface. The electron beam is directed through the reference potential electrode and toward addressed regions on the target surface to stimulate emission of secondary electrons from the regions. The reference potential electrode is fixed at a substantially constant reference voltage and collects the secondary electrons emitted from the addressed regions, thereby applying the reference potential to the addressed regions.

In the display panel of the first embodiment, a layer of material having electro-optical properties is positioned between the inner surfaces of the first and second substrates. The display locations are defined by the overlapping areas of the column electrodes and the regions of the target surface that are scanned by the electron beam. The display locations appear as spots on the display screen. The spots are sufficiently small and positioned close to one another so that they are indistinguishable by an observer during normal viewing conditions.

The display panel is configured as described above so that for each display location, the secondary electrons emitted from the target surface function as an electrical switch that changes between a conducting state when the electron beam causes emission of the secondary electrons and a nonconducting state in the absence of the electron beam. The magnitude of the data drive signal on the column electrodes corresponds to the luminance of a display image.

Whenever it is in the conducting state, the electrical switch allows a data voltage of a magnitude representing that of a data drive signal to develop across the liquid crystal material at a location spatially aligned with the region addressed by the electron beam. Whenever it changes to the nonconducting state, the electrical switch allows the spatially aligned liquid crystal material to hold the data voltage across it for a time. The electrical switches (i.e., the secondary electrons) function, therefore, to select and store data across the liquid crystal material.

Light transmission through a display location is modulated by selectively generating and not generating secondary electrons by means of the electron beam. The modulation of light transmission depends on the magnitude of the applied data drive signal. A monochrome or black-and-white display system with gray scale luminance qualities can be implemented with the use of the present invention. A full color display system with controllable color intensity can be implemented by positioning within the black-and-white display system a color filter containing groups of spots in three primary colors spatially aligned with the display locations. A group of three display locations spatially aligned with a group of spots would, therefore, represent one image pixel whose color is determined by the relative intensities of the spots in the group.

The display system of the present invention is capable of rendering fully dynamic, gray scale images over a broad range of field rates to provide a high contrast display. The display system is capable of addressing thousands of lines of data at 60 Hz field rates and providing a wide range of viewing angles.

In the memory device of the second embodiment, the second substrate functions as the layer of dielectric material. The memory locations are defined by the overlapping areas of the column electrodes and the regions of the target surface scanned by the electron beam. The memory device is configured as described above so that for each memory location, the secondary electrons function as an electrical switch that changes between the conducting state and the nonconducting state. Amplifiers providing the data drive signals are configured as column electrode drive amplifiers in a data write mode and as column electrode sensing amplifiers in a data read mode.

Whenever it is in the conducting state, the electrical switch allows a data voltage of a magnitude representing that of a data drive signal to develop across the dielectric material at a location spatially aligned with the region of the target surface being addressed by the electron beam. This represents the data write mode of the memory device.

Whenever it changes to the nonconducting state, the electrical switch allows the spatially aligned dielectric material to hold the data voltage across it for a time. The column electrode sensing amplifier associated with the location applies a reference voltage to a column electrode spatially aligned with the region of the target surface being addressed by the electron beam. Whenever it returns to the conducting state, the electrical switch causes a change in the voltage across the dielectric material which change is proportional to the previously written data voltage and appears at the output of the column electrode sensing amplifier. This represents the data read mode of the memory device.

Certain modifications of the addressing structure described above could facilitate other means for applying the data voltage to the memory locations of the memory device. For example, substituting a photoconductive material for the dielectric material and using column electrodes having optically transparent properties would permit incident light to modulate the magnitude of the data voltages applied to the memory location in proportion to the intensity of incident light. Such an addressing structure could be implemented as part of an image sensing device or optical processing device.

Additional objects and advantages of the present invention will be apparent from the detailed description of preferred embodiments thereof, which proceeds with reference to the accompanying drawings.

DETAILED DESCRIPTION OF PREFERRED EMBODIMENTS

Figure 3:
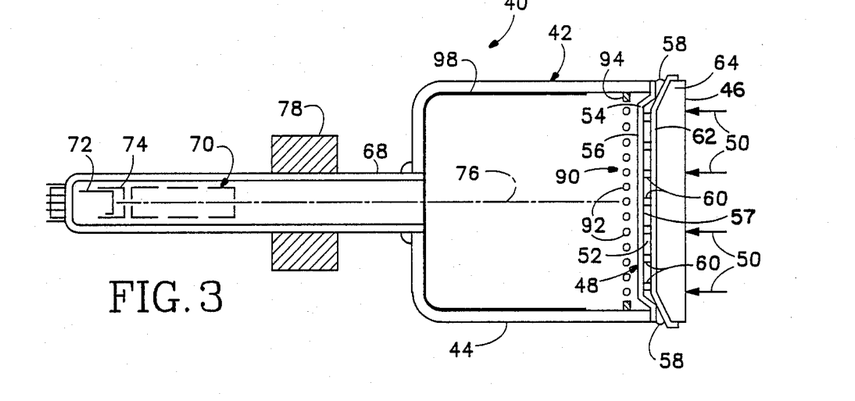
FIG. 3 is a schematic cross sectional view of a display system employing an addressing apparatus in accordance with the present invention.

FIG. 3 shows in cross section a light-reflective display system 40, which represents a first embodiment that implements the addressing structure and carries out the addressing method of the present invention.

With reference to FIG. 3, display system 40 comprises an evacuated envelope 42 that includes a ceramic body 44 and an optically transparent display surface 46 mounted thereto. Display system 40 includes an internal liquid crystal cell 48 (enlarged in FIG. 3 for clarity) that is disposed in the path of light rays 50 incident to display surface 46. Cell 48 comprises a layer 52 of liquid crystal material captured between display surface 46 and a thin, optically transparent target substrate 54 having a target surface 56 and a dielectric mirror 57.

Target substrate 54 is formed of a suitable dielectric material such as glass, a polyimide, or mica. The mica can be coated with a layer of magnesium oxide (MgO) as described in U.S. Pat. No. 4,744,636 of Haven et al., Electron Beam-Addressed Liquid Crystal Cell. The MgO coating provides a relatively high secondary electron emission ratio. The side margins of display surface 46 and target substrate 54 are sealed to the body 44 with a ceramic frit seal 58 or other suitable material. Preferably, the cell is assembled with the target substrate stretched over a plurality of spacers 60 of substantially uniform height, in the manner described in copending U.S. patent application Ser. No. 07/046,826 of Chitwood et al., Liquid Crystal Cell and Method of Assembly of Same. The resulting tension stresses in the target substrate 54 secure the substrate in place so that the liquid crystal cell 48 will maintain a uniform thickness.

Multiple optically transparent thin, narrow, nonoverlapping electrodes 62 (only one shown in FIG. 3) formed of indium tin oxide (ITO) are arranged in vertical columns on the inner major surface of an electrically nonconductive, optically transparent display substrate 64. (The electrodes 62 are hereinafter referred to as "column electrodes 62.")

Envelope 42 further comprises a tubular glass neck 68, one end of which is frit sealed to a side of body 44 opposite display surface 46. An addressing electron emitting means or gun 70 is mounted within neck 68. Gun 70 includes a cathode 72, a control grid 74, and associated electrodes for forming an electron beam 76 that is directed toward target substrate 54 of liquid crystal cell 48. Electron beam 76 is of substantially constant beam current and is scanned in a raster pattern 79 (FIG. 4) across target surface 56 in response to suitable electrical signals supplied by deflection circuitry (not shown) to an electromagnetic deflection yoke 78 supported on neck 68. (Display system 40 could alternatively be constructed with an electrostatic deflection structure.)

Gun 70 is operated so that the electrons in beam 76 strike target surface 56 with an energy that causes the emission of secondary electrons with a secondary electron ratio of greater than 1. The secondary electron emission ratio is defined as the number of electrons emitted by target surface 56 for each incident electron striking target surface 56.

Figure 4:
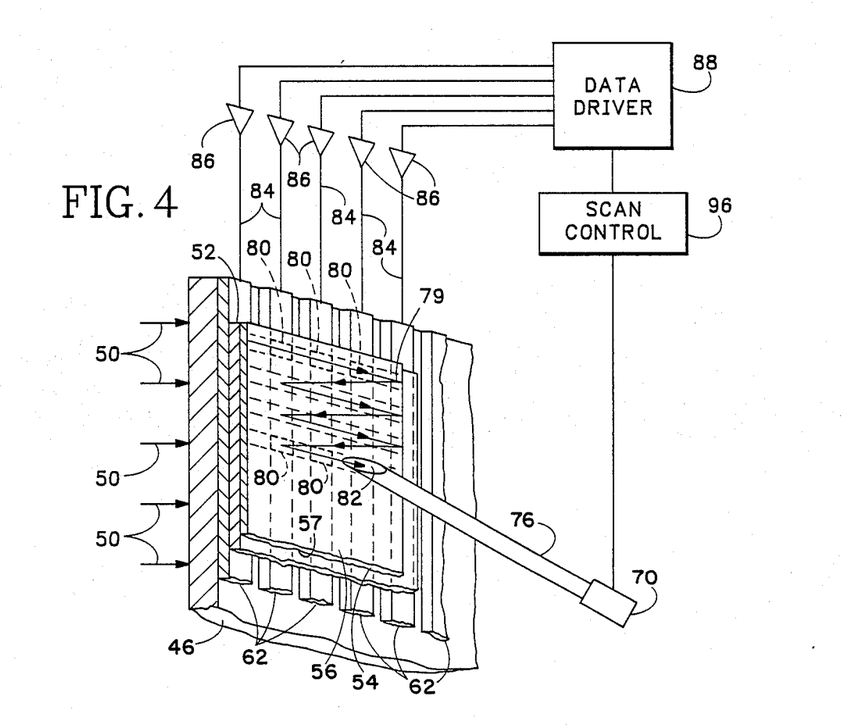
FIG. 4 is a fragmentary isometric view with portions broken away that shows different depthwise views of the interior of the display surface of the system of FIG. 3.

FIG. 4 shows that display surface 46 contains a pattern of pixels formed by a rectangular planar array of nominally identical data storage or display locations 80 mutually spaced apart by predetermined distances in the vertical and horizontal directions. Each display location 80 in the array represents the overlapping portions of column electrodes 62 arranged in vertical columns and the regions of target substrate 54 over which electron beam 76 is scanned. The display locations 80 in each horizontal scan of electron beam 76 represent one line of data.

The widths of column electrodes 62 determine the horizontal dimensions of display locations 80, and the vertical (minor) axis of an elliptical "footprint" 82 of electron beam 76 on target surface 56 determines the vertical dimensions of display locations 80. As a result, the horizontal width of electron beam 76 does not affect the resolution of display system 40. Electron beam 76 is generated, therefore, with a substantial amount of astigmatism so that the vertical resolution of the beam may be controlled substantially independently of the beam current.

Column electrodes 62 receive data drive signals of the analog voltage type developed on parallel output conductors 84 by different ones of the output amplifiers 86 of a data drive means or circuit 88. The data drive signals correspond to video or other input signals that are applied to column electrodes 62 to modulate the potential differences established across liquid crystal cell 48 in accordance with the video image to be rendered on display surface 46. Electron beam 76 addresses display locations 80 in cooperation with a substantially electron transparent reference potential electrode 90 (FIG. 3, omitted from FIG. 4 for clarity) that is positioned over and in substantially parallel spaced-apart relation to target surface 56.

Figure 5:
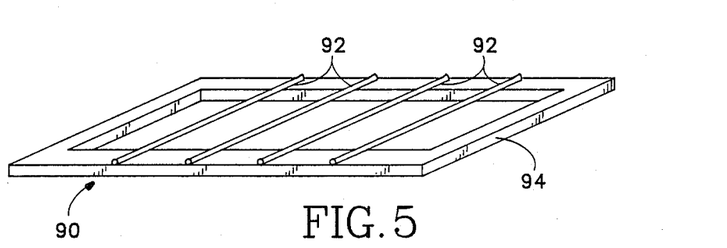
FIG. 5 shows the construction of the reference potential electrode incorporated in the display system of FIG. 3.

Reference electrode 90 is electrically connected to ground and comprises, for example, a grid of parallel wire segments aligned transverse to column electrodes 62 and formed by attaching segments of wire 92 of about five microns in diameter to a frame 94, as shown in FIG. 5. Alternatively, the grid may be constructed of crossed wire segments that form a mesh configuration. Electron beam 76 is directed through reference electrode 90 and toward target surface 56.

A conductive coating 98 (FIG. 3) on the interior surface of ceramic body 44 is electrically connected to a potential of about 100 volts (not shown) relative to the reference or ground potential on reference electrode 90. Coating 98 prevents the inner surface of body 44 from accumulating electrical charge during the operation of display system 40 and functions to collect stray secondary electrons that propagate past reference electrode 90. Such electrons could otherwise alter the potential differences established across liquid crystal cell 48 at previously addressed display locations 80, thereby changing the video image.

To synthesize an image on the entire area of display surface 46, display system 40 employs a scan control circuit 96 that coordinates the functions of data driver 88 and electron gun 70 so that all columns of display locations 80 of display system 40 are addressed by electron beam 76 in raster scan fashion. Display system 40 may employ electro-optic materials of different types such as the light-scattering encapsulated nematic liquid crystal materials. It will be appreciated that such an electro-optic material in reflective display system 40 provides modulation of light intensity without the placement of polarizing filters in the path of the incident light rays 50.

For a transmissive mode of operation, the display system could employ a twisted nematic liquid crystal as the electro-optic material. In such a system, the electron gun would be positioned at an acute angle relative to the display surface, and a light-transmissive window into the evacuated body would be positioned parallel to and opposite the display surface. A first light polarizing filter would be positioned outside the display surface, and a second polarizing filter would be positioned outside the light-transmissive window. As a result, light transmitted through the polarizing filters and the transmissive display system is intensity modulated in accordance with the video voltages established across the display locations.

Figure 6:
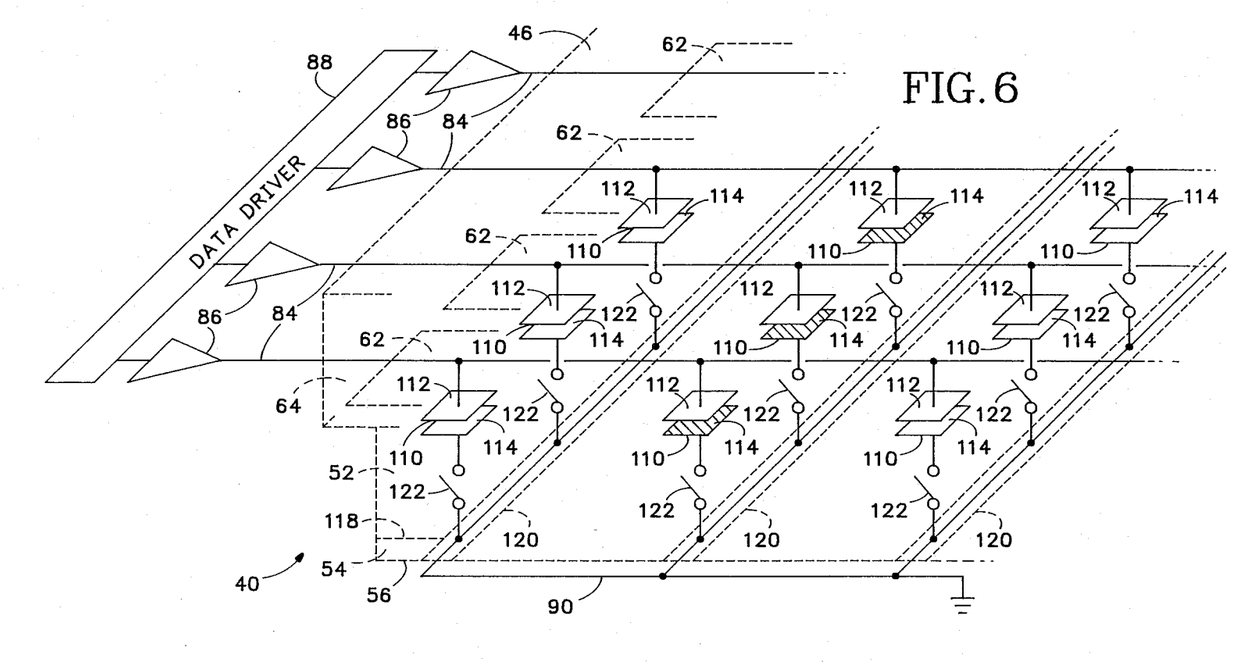
FIG. 6 is an equivalent circuit diagram showing for the display system of FIG. 3 the operation of the secondary electrons as switches for an exemplary row being scanned by the electron beam and three exemplary data columns receiving data drive signals.

The principles underlying the operation of display system 40 are that 1) each of its display locations 80 functions as a sampling capacitor for analog voltage data applied to the column electrode 62 forming a part of the display location and 2) the secondary electrons emitted from target substrate 54 when it is struck by electron beam 76 function as a sampling switch. FIG. 6 is an equivalent circuit to which the following explanation of the operation of display system 40 refers.

With reference to FIG. 6, each of display locations 80 of display system 40 can be modeled as a capacitor 110 (hereinafter "capacitor model 110") whose top plate 112 represents one of the column electrodes 62 and whose bottom plate 114 represents the target surface 56. Capacitor model 110 represents the capacitive liquid crystal cell formed by an overlapping region of a column electrode 62 and a row 120 scanned by electron beam 76. The description herein of the operation of display system 40 refers to the capacitor model 110.

In accordance with the basic addressing procedure, data driver 88 captures a first line of data, which represents discrete samples of the time-varying voltage of the analog data signal in a time interval of predetermined duration. The sample of the magnitude of the data signal at a particular instance within the time interval represents the magnitude of the analog voltage applied to a capacitor model 110 in a corresponding column position of a row 120 across which electron beam 76 is scanned. Data driver 88 develops on its output amplifiers 86 the analog voltages that are applied to column electrodes 62.

In FIG. 6, four exemplary output amplifiers 86 of data driver 88 deliver analog voltages of positive polarity to the respective ones of column electrodes 62 to which they are connected. The application of a positive voltage on a column electrode 62 induces on target surface 56 a voltage that is essentially equal to the magnitude of the applied voltage. This causes no change in the potential difference across capacitor model 110 and is represented in FIG. 6 by a top plate 112 and a bottom plate 114 with white surfaces.

At this instance, no secondary electrons are being emitted from target substrate 54, and the analog voltage developed on plates 112 and 114 of capacitor model 110 is positive with respect to the ground voltage on reference potential electrode 90. Whenever electron beam 76 is scanned across target surface 56, secondary electrons are emitted therefrom. The row 120 across which electron beam 76 is scanned is represented in FIG. 6 by dark, thick dashed lines.

The incident and secondary electrons neutralize the induced positive voltage on the bottom plates 114 of capacitor models 110. The capacitor models 110 in the scanned row 120 are charged with the data voltages applied across them. This condition is indicated in FIG. 6 by top plates 112 with white surfaces and bottom plates 114 with lined surfaces.

Each of the rows 120 of display locations 80 is scanned by electron beam 76 in a similar manner until the entire display surface 36 is completely addressed and thereby stores an image field of data. The voltage remains stored across each of the capacitor models 110 in the scanned row 120 for a time at least as long as the duration of the image field and is independent of subsequent changes in data voltage applied to top plate 112 of capacitor model 110. The voltage stored across each of the capacitor models 110 changes in accordance with the analog data voltages representing the display data of the next succeeding image field.

The description presented above indicates that the action of the incident and secondary electrons generated by electron beam 76 operate as an electrical switch 122 whose contact position changes between binary switching states. The switches 122 shown in FIG. 6 in the closed position are electrically connected to reference electrode 90 by the action of the secondary electrons emitted from target substrate 54, such that the corresponding display locations 80 are in a conducting state. The absence of the secondary electrons causes a display location 80 to be in a nonconducting state. The switches 122 shown in FIG. 6 in the open position are not electrically connected to reference electrode 90. In FIG. 6, the row 120 shown in the middle of the three rows of capacitor models 110 is scanned by electron beam 76 to establish and store the display data voltages across them.

To function as a switch, the secondary electrons provide an electrically conductive path from target substrate 54 to reference electrode 90. The secondary electrons emitted along a row 120 scanned by electron beam 76 provide a ground path to the capacitor model 110 representing the portion of liquid crystal material positioned adjacent the scanned row. This allows the capacitor models 110 to sample the analog data voltages applied to column electrodes 62. The absence of the electron beam 76 and of the secondary electrons acts to remove the conducting path, thereby allowing the data sample to be held across the display location 80 (FIG. 4). The voltages remain stored across liquid crystal cell 48 until voltages representing a new line of data in a subsequent image field are developed across the cell 48, or until the sampled voltages are erased in an "erase field." The above-described addressing structure and technique provide signals of essentially 100% duty cycle to every one of the display locations 80.

Display system 40 may be configured to employ image fields that are in a noninterlaced format or an interlaced format. In a display system 40 whose image fields are in a noninterlaced format, the analog data voltages applied to column electrodes 62 in the next succeeding image field are of opposite polarity. Alternating between positive and negative polarities from one image field to the next image field provides a long term zero net DC voltage component, which is typically required for long term operation of liquid crystal materials. The liquid crystal material produces the gray scale effect in response to the root-mean-square (rms) value of the applied analog voltage data. The display image produced is, therefore, unaffected by alternate changes in polarity of the analog voltage data.

Display system 40 preferably is configured to employ image fields arranged in an interlaced format. The reasons are that the rows 120 scanned by electron beam 76 are positioned close together and that the secondary electrons emitted from a row 120 in a noninterlaced format can alter the video data stored on adjacent rows. In a multiple interlace format, the successive rows 120 scanned in an image field are separated by a number of rows 120 that equals the number of image fields per image frame. For example, each image frame could comprise four image fields of which each image field comprises one-fourth the number of addressable rows. The number of image fields per image frame is selected so that the distance between successively addressed rows in an image field is much greater than the distance between target surface 56 and reference electrode 90.

Since the liquid crystal material is responsive to the rms value of the applied analog voltage data, the relatively short period of time during which voltage data is present on a column electrode 62 is compensated for by slightly increasing the magnitude of the data voltage. To achieve a long term zero voltage component in such a system, the analog data voltages applied to column electrodes 62 in successive frames are of opposite polarity. Alternatively, all of the image fields are of positive polarity but are erased by "erase fields," one of which occurs after each image field.

Figure 7A:
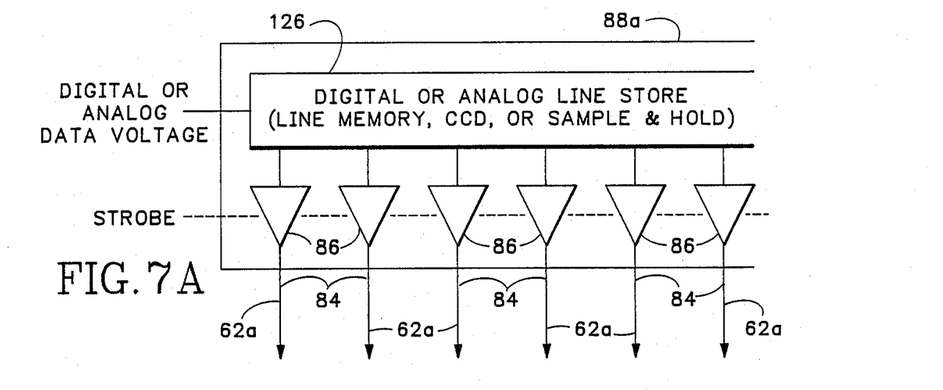
FIGS. 7A and 7B are diagrams of alternative electronic circuit designs of the data driver shown in FIG. 4.
Figure 7B:
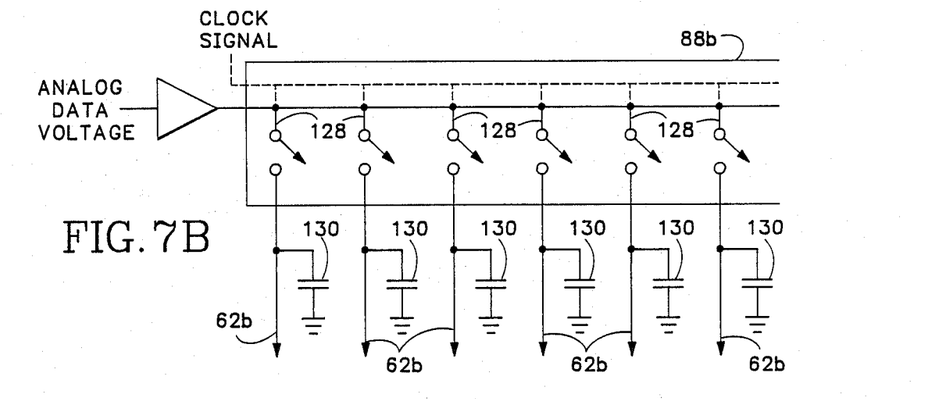

FIGS. 7A and 7B show alternative circuit designs for the data drivers 88a and 88b whose corresponding components are identified by identical reference numerals with the suffixes "a" and "b", respectively.

With reference to FIG. 7A, data driver 88a samples the data signal and stores it in a buffer memory 126. The data signal can be in analog or digital form. Buffer memory 126 can be of the charge-coupled device (CCD) type or the sample-and-hold type to store an analog data signal, and buffer memory 126 can be of the digital type to store a digital data signal. The devices 86 represent either buffer amplifiers or digital-to-analog converters, depending on whether buffer memory 126 holds analog voltages or digital data, respectively. Devices 86 permit the parallel transfer of analog voltages to column electrodes 62a. Data driver 88a is capable of high-speed operation because CCD and sample-and-hold circuits are capable of high-speed acquisition and the analog voltages can be transferred simultaneously in parallel to the column electrodes 62a.

With reference to FIG. 7B, data driver 88b samples the analog data signal in serial fashion by sequentially closing and opening one at a time different ones of a set of switches 128. Each of the switches 128 is connected to a capacitor 130. The capacitors 130 accumulate charge from the data signal when the switch is closed. This provides analog voltage samples of the data signal to the column electrodes 62b in a row from one end to the other end. A sampling clock signal applied to the control electrodes of switches 128 sets the sampling rate.

Figure 8A:
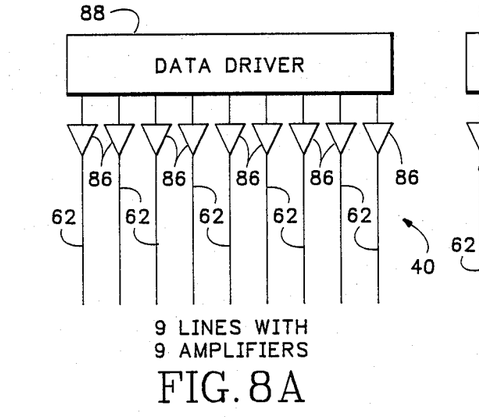
FIGS. 8A and 8B are diagrams of alternative column electrode wiring configurations that illustrate a technique for reducing the required number of outputs of the data driver of FIG. 4.
Figure 8B:
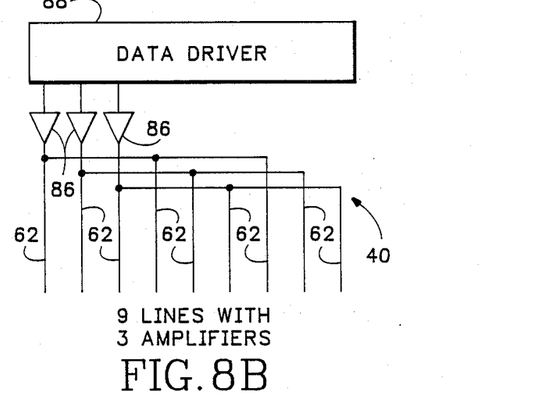

FIGS. 8A and 8B compare the number of output amplifiers 86 required for exemplary display systems 40 having nine channels. The display system 40 of FIG. 8A has nine different output amplifiers 86, data driver 88 driving the amplifiers for different single ones of column electrodes 62. The display system 40 of FIG. 8B has three time-multiplexed output amplifiers 86 electrically connected to column electrodes 62 that are grouped in sets of three. In display system 40 of FIG. 8B, only one set of column electrodes 62 receives data drive signals for a time interval of predetermined duration. During the time interval, display system 40 addresses the display locations 80 by scanning electron beam 76 across one of the column electrodes 62 in the one set. Each display location 80 on display surface 46 is addressed by coordinating the scanning of electron beam 76 with the switching to different ones of the sets of column electrodes 62 and the time multiplexing of output amplifiers 86.

The configuration of electrical connections of the output amplifiers 86 shown in FIG. 8B provides an addressing structure that requires fewer output amplifiers 86 than the number required by the addressing structure shown in FIG. 8A. In the exemplary display systems 40 of FIGS. 8A and 8B, the number of data output amplifiers 86 is reduced from nine to three, respectively. However, output amplifiers 86 of data driver 88 shown in FIG. 8B must be operated at a signal bandwidth that is three times greater than the signal bandwidth at which output amplifiers of FIG. 8A may be operated. Such an inverse relationship between the number of output amplifiers 86 and their signal bandwidths provides a design flexibility in which optimal system performance can be obtained while system cost is reduced.

Display system 40 can be modified to form a versatile analog data memory system 140 that contains an array of memory locations and that represents a second embodiment that implements the addressing structure and carries out the method of the present invention. Such modifications include the removal of layer 52 of liquid crystal material shown in FIGS. 3, 4, and 6.

Figure 9:
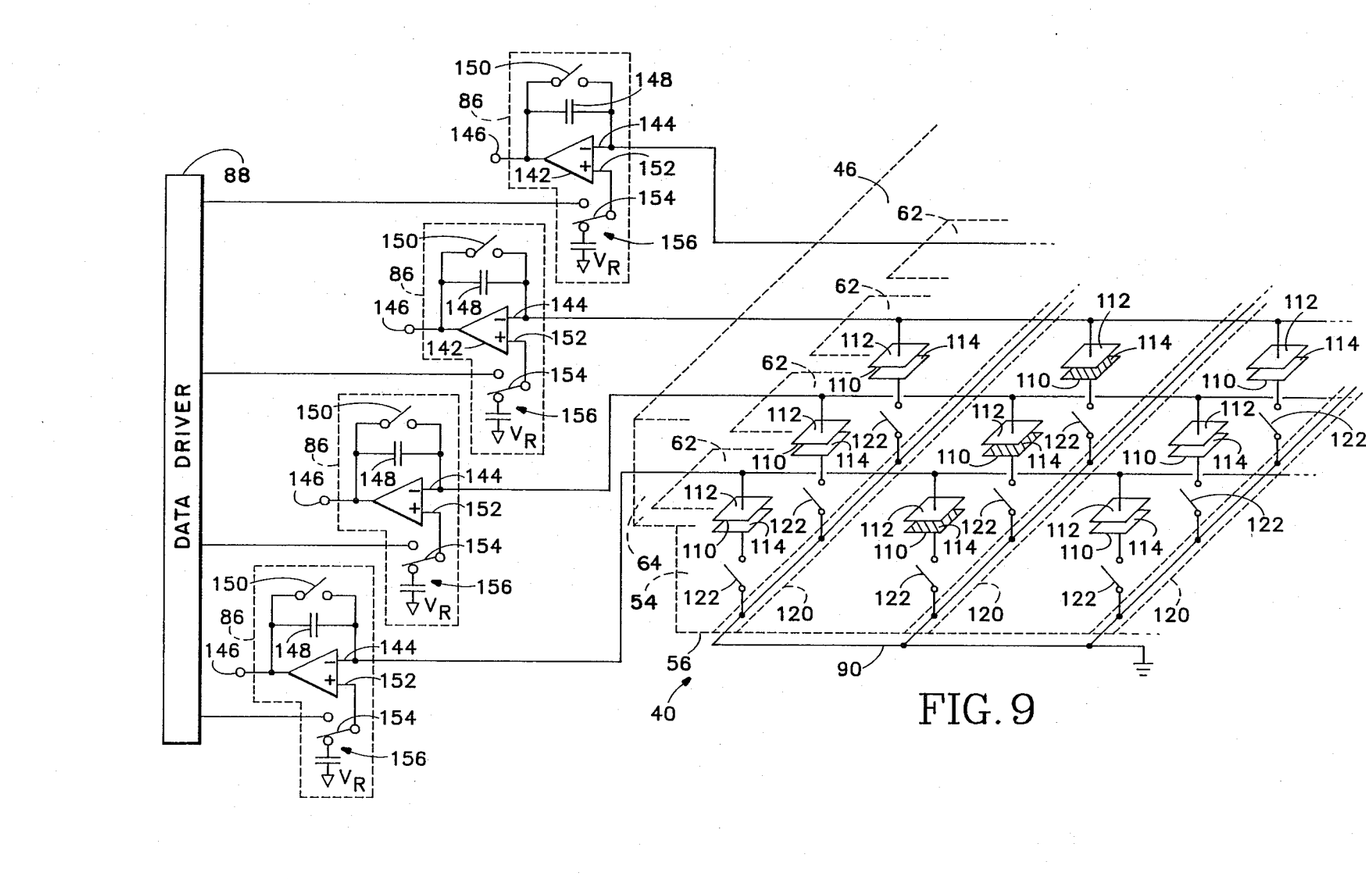
FIG. 9 is an equivalent circuit diagram showing the operation of the secondary electrons as a switches in cooperation with the data drive circuit to form an addressing structure for selectively writing data into and reading data out of a memory element.

FIG. 9 shows the equivalent circuit for memory system 140. Except as indicated above, the systems of FIGS. 6 and 9 are similar; therefore, corresponding components in FIGS. 6 and 9 bear identical reference numerals. In memory system 140, target substrate 54 functions as the dielectric element of capacitor model 110, which represents a memory element. It will be appreciated that column electrodes 62 need not be formed of optically transparent material and may advantageously be formed of aluminum or other conductive material. The data drive output amplifiers 86 of memory system 140 comprise circuit elements that function as column electrode drive amplifiers in the data write mode and as column electrode sensing amplifiers in the data read mode. The electron guns 70 of the systems of FIGS. 6 and 9 are similar.

With reference to FIG. 9, each of the output amplifiers 86 of data drive circuit 88 comprises a high-speed operational amplifier 142 that has connected between its inverting input terminal 144 and output terminal 146 a parallel combination including a feedback capacitor 148 and a switch element 150. Amplifier 442 is selectively configured as a voltage follower in the data write mode by actuating switch element 150 to its conducting state and as an integrator in the data read mode by actuating switch element 150 to its nonconducting state. The noninverting input terminal 152 of operational amplifier 142 is connected to the movable contact terminal 154 of a switch element 156, which selectively connects noninverting input terminal 152 to either a reference voltage $V_R$ or an output signal conductor of data drive circuit 88.

Whenever it is in the data write mode, output amplifier 86 delivers a data drive signal to the column electrode 62 forming a memory location in memory system 140. This is accomplished by configuring operational amplifier 142 as a voltage follower and positioning movable contact terminal 154 of switch element 156 to deliver the data drive signal from data drive circuit 88 to noninverting input terminal 152 of operational amplifier 142. During this time, electron beam 76 is scanned across a row 120 and stimulates emission of secondary electrons from target substrate 54, thereby developing a data voltage across capacitor model 110 in the manner as described above with reference to FIG. 6. The magnitude of the voltage across capacitor model 110 represents that of the data drive signal.

Whenever it is in the data read mode, data amplifier 86 senses the current in the column electrode 62 forming the memory location in memory system 140. This is accomplished by means of a two-step process.

First, movable contact terminal 154 of switch element 156 is positioned to deliver voltage reference $V_R$ to noninverting input terminal 152 of operational amplifier 142. During this time, electron beam 76 is not scanned across the row 120, thereby allowing the reference voltage $V_R$ to be established on output terminal 146 of operational amplifier 142, column electrode 62, and upper plate 112 of capacitor model 110. The voltage across feedback capacitor 148 is thereby normalized to 0.0 volts. It will be appreciated, however, that memory system 140 can be configured to operate with an offset voltage between the inputs and outputs of each operational amplifier 142.

Second, after the voltage across feedback capacitor 148 stabilizes to 0.0 volts, operational amplifier 142 is configured as an integrator whose input terminal 144 is prepared to receive the current flowing from column electrode 62. The voltage difference between lower plate 114 of capacitor model 110 and reference electrode 90 is a function of $V_R$ and the previously written data voltage across capacitor model 110. Whenever electron beam 76 is scanned across a row 120 and stimulates emission of secondary electrons, lower plate 114 of capacitor model 110 is electrically connected to reference electrode 90, thereby changing the voltage across capacitor model 110. Operational amplifier 142, now configured as an integrator, senses this change in voltage and provides on its output terminal 146 a voltage proportional to the data voltage previously developed across capacitor model 110.

There exist other alternatives for developing the data voltage across capacitor model 110 to promote its function as a memory location. For example, substituting photoconductive material for the target substrate 54, using optically transparent column electrodes 62, and exposing memory system 140 to light would modulate the voltages across capacitor models 110 in proportion to the intensity of the light incident on memory system 140. The voltage change developed across capacitor model 110 in response to the intensity of incident light would be restored during the data read mode, as described above. The photoconductive material 54 and optically transparent column electrodes 62 provide, therefore, an image sensing device with analog data memory properties.

In the above-described image sensing device, the construction of target substrate 54 of photoconductive material as multiple electrically isolated strips or discrete islands would avoid conduction between adjacent capacitor models 110. Constructing a strip of metal or other conductive material along the margin of the optically transparent electrodes would increase efficiency of data collection in the data read mode by decreasing the time required to read out the data voltage developed across capacitor models 110.

The above-described image sensing device uses the photoconductive properties of substrate 54 of photoconductive material during the period between the data read modes. It is also possible to make direct use of the photoconductive properties of substrate 54, in which case the storage location 80 might be more properly characterized as a "sensing" element and capacitor model 110 would be more properly depicted as an electrical current modulating device. This can be accomplished by applying to column electrode 62 a voltage that establishes a voltage gradient across substrate 54 during the time electron beam 76 is scanned across a row 120. The electrical current flowing from electron beam 76, through substrate 54 and column electrode 62, to output terminal 146 of operational amplifier 142 would constitute the output signal. Replacing feedback capacitor 148 with a resistor would make the voltage appearing on output terminal 146 of operational amplifier 142 proportional to the current flowing through substrate 54.

It will be obvious to those having skill in the art that many changes may be made in the above described details of the preferred embodiments of the present invention without departing from the underlying principles thereof. The scope of the present invention should be determined, therefore, only by the following claims.

I claim:

1. An addressable electro-optic system having multiple light pattern data storage locations, comprising:
    first and second substrates having a layer of material with electro-optic properties positioned between them, the first substrate supporting on a major surface thereof plural nonoverlapping first electrodes that extend in a first direction and the second substrate having a target surface;
    first biasing means for applying first electrical signals to different ones of the first electrodes;
    beam emitting means for emitting a beam of primary electrons directed toward the target surface of the second substrate to strike preselected regions of the target surface and thereby to cause an emission of secondary electrons, the preselected regions being aligned with corresponding ones of the first electrodes; and
    second biasing means cooperating with the target surface for collecting the secondary electrons emitted from the target surface and thereby developing electrostatic potentials at the preselected regions, the simultaneous application of one of the first electrical signals to a selected one of the first electrodes and the striking of a corresponding preselected region of the target surface by the primary electrons changing a property of the electro-optic material.

2. The system of claim 1 in which the second substrate includes an inner surface that is disposed face-to-face and spaced-apart from the major surface of the first substrate and in which the layer of material with electro-optic properties is positioned between the major surface of the first substrate and the inner surface of the second substrate.

3. The system of claim 1 in which the layer of electro-optic material is of the liquid crystal type.

4. The system of claim 3 in which the liquid crystal material is of the nematic type.

5. The system of claim 1 in which the first electrodes are substantially optically transparent over a preselected range of visible wavelengths of light.

6. The system of claim 1 in which the second biasing means comprises an electrically conductive grid.

7. The system of claim 6 in which the grid is fixed at a substantially constant potential.

8. The system of claim 1 in which the beam emitting means emits the beam of primary electrons at a substantially constant beam current.

9. The system of claim 1 in which the number of secondary electrons emitted from the target surface is greater than the number of primary electrons striking the target surface.

10. The system of claim 1 in which the beam emitting means scans the beam of primary electrons across the target surface in a raster-scan pattern that defines plural rows extending in a second direction.

11. The system of claim 10 in which the second direction is transverse to the first direction.

12. The system of claim 1 in which the change in the property of the electro-optic material is a function of the magnitudes of the first electrical signals.

13. A method of addressing a storage location for optical data, the storage location including a layer of material having electro-optic properties, comprising:
    inducing a signal on one of multiple nonoverlapping first electrically conductive stripe regions positioned adjacent a first major surface of the layer, the signal corresponding to the optical data;
    effecting emission of electrons from a region of a dielectric substrate positioned adjacent a second major surface of the layer, the location being defined by overlapping portions of the one of the first stripe regions and the region of dielectric substrate; and
    developing an electrostatic potential that directs electrons emitted from the dielectric substrate toward an electron-collecting surface to change a property of the layer of electro-optic material in accordance with the optical data and thereby effect storage of the signal by the storage location.

14. The method of claim 13 in which the second stripe region is transverse to the multiple first stripe regions.

15. The method of claim 13 in which the layer of electro-optic material is of the liquid crystal type.

16. The method of claim 13, further comprising positioning the storage location to receive incident light propagating from a light source and thereby change the transmissivity of the incident light by an amount corresponding to the optical data.

17. The method of claim 13, further comprising positioning a color filter in optical association with the storage location to receive incident light propagating from a light source and thereby impart a color value to the incident light of an amount corresponding to the optical data.

18. In an electro-optic system having multiple light pattern data storage locations, an addressing structure for addressing the data storage locations, comprising:
    substrate means having first and second major surfaces for supporting on the first major surface plural nonoverlapping first electrodes that extend in a first direction;
    first biasing means for applying first electrical signals to different ones of the first electrodes;

beam emitting means for emitting a beam of primary electrons directed toward the second major surface to strike preselected regions of the second major surface and thereby cause an emission of secondary electrons, the preselected regions being aligned with corresponding ones of the first electrodes; and second biasing means cooperating with the second major surface for collecting the secondary electrons emitted from the second major surface and thereby developing electrostatic potentials at the preselected regions, the simultaneous application of one of the first electrical signals to a selected one of the first electrodes and the striking of a corresponding preselected region of the second major surface by the primary electrons addressing a selected one of the data storage locations.

19. The structure of claim 18 in which the first and second major surfaces are positioned on respective first and second substrates between which is positioned a layer of material having electro-optic properties.

20. The structure of claim 19 in which the layer of material having electro-optic properties is positioned between inner surfaces of the first and second substrates and in which the first electrodes are supported on the inner surface of the first substrate.

21. The structure of claim 18 in which the beam of primary electrons is of elliptical cross section with major and minor axes, and the beam is formed with a sufficient amount of astigmatism so that the resolution of the beam along the minor axis may be is controllable substantially independently of the beam current.

22. The structure of claim 20 in which the minor axis is substantially parallel to the first direction.

* * * * *